US009799296B2

(12) United States Patent
Zhao

(10) Patent No.: US 9,799,296 B2
(45) Date of Patent: Oct. 24, 2017

(54) CMOS GOA CIRCUIT

(71) Applicant: Wuhan China Star Optoelectronics Technology Co., Ltd., Wuhan (CN)

(72) Inventor: Mang Zhao, Wuhan (CN)

(73) Assignee: WUHAN CHINA STGAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 142 days.

(21) Appl. No.: 14/913,981

(22) PCT Filed: Dec. 22, 2015

(86) PCT No.: PCT/CN2015/098342
§ 371 (c)(1),
(2) Date: Feb. 23, 2016

(87) PCT Pub. No.: WO2017/054338
PCT Pub. Date: Apr. 6, 2017

(65) Prior Publication Data

US 2017/0263203 A1 Sep. 14, 2017

(30) Foreign Application Priority Data

Sep. 28, 2015 (CN) .......................... 2015 1 0629067

(51) Int. Cl.
*G09G 3/36* (2006.01)

(52) U.S. Cl.
CPC ......... *G09G 3/3677* (2013.01); *G09G 3/3696* (2013.01); *G09G 2300/0408* (2013.01); *G09G 2300/0819* (2013.01); *G09G 2310/0286* (2013.01); *G09G 2310/0291* (2013.01); *G09G 2310/08* (2013.01); *G09G 2330/021* (2013.01)

(58) Field of Classification Search
CPC ... G09G 2320/0223; G09G 2320/0219; G09G 2310/066; G09G 3/3696; G09G 2300/0819; G09G 2310/06; G06F 3/147; G06F 1/26; G06F 17/5045; G06F 17/5068; G06F 17/5081; G06F 1/12
USPC ...................................... 345/87, 98, 99, 100
See application file for complete search history.

(56) References Cited

U.S. PATENT DOCUMENTS 9,224,347 B2 * 12/2015 Han .................... G09G 3/3611
2015/0228354 A1 * 8/2015 Qing ...................... G11C 19/28 345/100
2016/0365050 A1 * 12/2016 Qing ................... G09G 3/3677

* cited by examiner

*Primary Examiner* — Duc Dinh
(74) *Attorney, Agent, or Firm* — Leong C. Lei

(57) ABSTRACT

The invention provides a CMOS GOA circuit, by disposing a feedback regulation module (4) connected to output buffer module (3) and signal processing module (2) in the GOA unit, to achieve the following: when the scan driver signal (G(N)) becomes high, the positive feedback from the sixth N-type TFT (T6) of feedback regulation module (4) will enhance the pull-down capability of the signal processing module (2) to reduce the rising time of the scan driver signal (G(N)) waveform; when the scan driver signal (G(N)) becomes low, the positive feedback from the fifth P-type TFT (T5) of feedback regulation module (4) will enhance the pull-up capability of the signal processing module (2) to reduce the falling time of scan driver signal (G(N)) waveform; that is, the invention can reduce the RC loading of scan driver signal (G(N)) and improve the stability of high resolution display panel.

14 Claims, 5 Drawing Sheets

CMOS GOA CIRCUIT

BACKGROUND OF THE INVENTION

1. Field of the Invention

The present invention relates to the field of display, and in particular to a complementary metal-oxide-semiconductor (CMOS) gate driver an array (GOA) circuit.

2. The Related Arts

The gate driver on array (GOA) technology is the array substrate column drive technology, by using the thin film transistor (TFT) liquid crystal display (LCD) array processor to manufacture the gate scan driver circuit on the TFT array substrate to realize the column-by-column scan driving. The GOA technology has the advantages of low manufacture cost and the ability to realize narrow-border panels, and is used by many types of displays. GOA circuit has two basic functions: first, to output scan driving signal to drive the gate line in the panel to turn on the TFT in the display area so as to charge the pixels; and the second is the shift register; when the N-th scan driving signal is outputted, the clock control is used to perform outputting the (N+1)-th scan driving signal, and so on.

With the development of the low temperature poly-silicon (LTPS) semiconductor TFT, LTPS TFT liquid crystal display (LCD) attracts much attention. Because LTPS silicon crystal is more orderly arranged than non-crystal silicon, LTPS semiconductor shows a ultra-high carrier migration rate. The LCD utilizing LTPS TFT has the advantages of high resolution, rapid response, high luminance, and high opening ratio. Correspondingly, the integrated circuit (IC) around the panel of LTPS TFT LCD also becomes a focus of the display technology.

FIG. 1 is a schematic view showing a known CMOS GOA circuit, comprising a plurality of cascade GOA units, for a positive integer N, the N-th stage GOA unit comprising: an input and latch module 100, a signal processing module 300, and an output buffer module 400.

The input and latch module 100 is connected to a stage-propagated signal Q(N−1) of the previous stage GOA unit, a first clock signal CK1, and a first inverted clock signal XCK1, to obtain a stage-propagated signal Q(N) of the current stage based on the stage-propagated signal Q(N−1) of the previous stage GOA unit, the first clock signal CK1, and the first inverted clock signal XCK1, and then latches the stage-propagated signal Q(N) to input the propagated signal Q(N) to the signal processing module 300.

The signal processing module 300 receives the stage-propagated signal Q(N), a second clock signal CK2, a constant high level voltage VGH, a constant low level voltage VGL, and performs a NAND logic operation on the second clock signal CK2 and the stage-propagated signal Q(N) to generate a scan driver signal G(N) for the N-th stage GOA unit.

The output buffer module 400 is connected to the signal processing module 300, to increase the driving power of the scan driver signal G(N) and reduce the resistor-capacitor loading (RC loading) during the signal propagation.

Refer to FIG. 1 and FIG. 2. Before the GOA circuit in FIG. 1 starts normal operation, a voltage level reset process must be performed on the stage-propagated signal and scan driver signal. Therefore, each stage GOA unit of a known CMOS GOA circuit must also comprise a reset module 200. Take N-th stage GOA unit as an example. The reset module 200 comprises a P-type TFT, with the gate connected to a reset signal Reset, the source connected to the constant high level voltage VGH, and the drain connected to an input end of the inverter F in the input and latch module 100. When the reset signal Reset inputs a low level voltage, the P-type TFT becomes conductive and the inverter F performs inverting on the constant high level voltage VGH to pull down the voltage level of the stage-propagated signal Q(N), and then uses the low level stage-propagated signal Q(N) to make the scan driver signal G(N) become low level voltage. As such, the resetting of the stage-propagated signal Q(N) and the scan driver signal G(N) is realized. A STV signal is the circuit activation signal and a stage-propagated signal inputted to the first stage GOA unit. The STV is from the IC signal end.

The above know CMOS GOA circuit uses the clock signal and stage-propagated signal Q(N) to perform logic gate control, and the signal processing module 300 generates the scan driver signal G(N) for N-th stage GOA unit. The clock signal is from the IC, and will experience a large RC delay during the propagation to cause the deformation of the clock signal. As shown in FIG. 2, the delay of the clock signal will cause the delay of the output from the signal processing module 300, leading to affecting the output of the scan driver signal G(N) to cause a larger RC delay for scan driver signal G(N). When driving high resolution panels, a larger RC delay will cause abnormal display of the panels.

SUMMARY OF THE INVENTION

The object of the present invention is to provide a CMOS GOA circuit, able to reduce the rising time and falling time of the scan driver signal to reduce, reduce the RC loading and enhance the stability of the display panel.

To achieve the above object, the present invention provides a CMOS GOA circuit, which comprises: a plurality of cascade GOA units, for a positive integer N, the N-th stage GOA unit comprising: an input and latch module, a signal processing module connected to the input and latch module, an output buffer module connected to the signal processing module, and a feedback regulation module connected to the output buffer module and the signal processing module; wherein the input and latch module is connected to input a stage-propagated signal from a previous stage (N−1)-th stage GOA unit, a first clock signal, a first inverted clock signal, for inverting the stage-propagated signal form the (N−1)-th stage GOA unit to obtain an inverted stage-propagated signal, and then inverting the inverted stage-propagated signal to obtain a stage-propagated signal and latching the stage-propagated signal; the signal processing module is connected to input the stage-propagated signal, a second clock signal, a constant high level voltage and a constant low level voltage, for performing a NAND operation on the second clock signal and the stage-propagated signal to generate a scan driver signal for the N-th stage GOA unit; the output buffer module comprises an odd-number of serially connected first inverters, for outputting the scan driver signal and enhancing the driving power of the scan driver signal; and the feedback regulation module comprises a fifth P-type thin film transistor (TFT), and a sixth N-type TFT; the fifth P-type TFT has a gate connected to an output end of the first first inverter of the output buffer module, a source connected to the constant high level voltage, and a drain connected to an input end of the first first inverter of the output buffer module and the output end of the signal processing module to enhance the pull-up capability of the signal processing module and reduce the falling time of the scan driver signal; the sixth N-type TFT has a gate connected to an output end of the first first inverter of the output buffer module, a source connected to the constant low level voltage to enhance the pull-down capability of the signal processing module and reduce the rising time of the scan driver signal.

The signal processing module comprises: a first N-type TFT, with a gate connected to the second clock signal, and a source connected to the constant low level voltage; a second N-type TFT, with a gate connected to the stage-propagated signal, a source connected to a drain of the first N-type TFT, and a drain connected to the output end of the signal processing module; a third P-type TFT, with a gate connected to the stage-propagated signal, a source connected to the constant high level voltage and a drain connected to the output end of the signal processing module; a fourth P-type TFT, with a gate connected to the second clock signal, a source connected to the constant high level voltage and a drain connected to the output end of the signal processing module.

Optionally, the drain of the sixth N-type TFT is connected to the drain of the first N-type TFT and the source of the second N-type TFT.

Optionally, the drain of the sixth N-type TFT is connected to the input end of the first first inverter of the output buffer module and the output end of the signal processing module.

The input and latch module comprises: a clock control input circuit, having two control ends connected to the first clock signal and the first inverted clock signal respectively, an input end connected to input the stage-propagated signal from the previous stage (N−1)-th stage GOA unit, and an output end to output an inverted stage-propagated signal by inverting the stage-propagated signal from the (N−1)-th stage GOA unit; a second inverter, having an input end connected to input the inverted stage-propagated signal, and an output end to output the stage-propagated signal; a lock control latch circuit, having two control ends connected to the first clock signal and the first inverted clock signal respectively, an input end connected to the stage-propagated signal, and an output end to output an inverted stage-propagated signal by inverting the stage-propagated signal.

The input and latch module further comprises: a third inverter, to invert the first clock signal to obtain the first inverted clock signal.

The CMOS GOA circuit further comprises a reset module, which further comprising: a seventh P-type TFT, with a gate connected to input a reset signal, a source connected to the constant high level voltage, and a drain connected to the input end of the second inverter.

In the first stage GOA circuit, the input end of the clock control input circuit is connected to the circuit activation signal.

Preferably, the output buffer module comprises: three first inverters serially connected, the input end of the first invert closest to the signal processing module is connected to the output end of the signal processing module, and the output end of the first inverter farthest from the signal processing module outputs the scan driver signal.

The present invention also provides a CMOS GOA circuit, which comprises: a plurality of cascade GOA units, for a positive integer N, the N-th stage GOA unit comprising: an input and latch module, a signal processing module connected to the input and latch module, an output buffer module connected to the signal processing module, and a feedback regulation module connected to the output buffer module and the signal processing module; wherein the input and latch module is connected to input a stage-propagated signal from a previous stage (N−1)-th stage GOA unit, a first clock signal, a first inverted clock signal, for inverting the stage-propagated signal form the (N−1)-th stage GOA unit to obtain an inverted stage-propagated signal, and then inverting the inverted stage-propagated signal to obtain a stage-propagated signal and latching the stage-propagated signal; the signal processing module is connected to input the stage-propagated signal, a second clock signal, a constant high level voltage and a constant low level voltage, for performing a NAND operation on the second clock signal and the stage-propagated signal to generate a scan driver signal for the N-th stage GOA unit; the output buffer module comprises an odd-number of serially connected first inverters, for outputting the scan driver signal and enhancing the driving power of the scan driver signal; and the feedback regulation module comprises a fifth P-type thin film transistor (TFT), and a sixth N-type TFT; the fifth P-type TFT has a gate connected to an output end of the first first inverter of the output buffer module, a source connected to the constant high level voltage, and a drain connected to an input end of the first first inverter of the output buffer module and the output end of the signal processing module to enhance the pull-up capability of the signal processing module and reduce the falling time of the scan driver signal; the sixth N-type TFT has a gate connected to an output end of the first first inverter of the output buffer module, a source connected to the constant low level voltage to enhance the pull-down capability of the signal processing module and reduce the rising time of the scan driver signal; the signal processing module comprises: a first N-type TFT, with a gate connected to the second clock signal, and a source connected to the constant low level voltage; a second N-type TFT, with a gate connected to the stage-propagated signal, a source connected to a drain of the first N-type TFT, and a drain connected to the output end of the signal processing module; a third P-type TFT, with a gate connected to the stage-propagated signal, a source connected to the constant high level voltage and a drain connected to the output end of the signal processing module; a fourth P-type TFT, with a gate connected to the second clock signal, a source connected to the constant high level voltage and a drain connected to the output end of the signal processing module; the drain of the sixth N-type TFT is connected to the drain of the first N-type TFT and the source of the second N-type TFT; the input and latch module comprises: a clock control input circuit, having two control ends connected to the first clock signal and the first inverted clock signal respectively, an input end connected to input the stage-propagated signal from the previous stage (N−1)-th stage GOA unit, and an output end to output an inverted stage-propagated signal by inverting the stage-propagated signal from the (N−1)-th stage GOA unit; a second inverter, having an input end connected to input the inverted stage-propagated signal, and an output end to output the stage-propagated signal; a lock control latch circuit, having two control ends connected to the first clock signal and the first inverted clock signal respectively, an input end connected to the stage-propagated signal from, and an output end to output an inverted stage-propagated signal by inverting the stage-propagated signal.

Compared to the known techniques, the present invention provides the following advantages: the present invention provides a CMOS GOA circuit, by disposing the feedback regulation module connected to the output buffer module and the signal processing module in the GOA unit, the present invention accomplishes the following: when the scan driver signal becomes high, the positive feedback from the sixth N-type TFT of the feedback regulation module will enhance the pull-down capability of the signal processing module so as to reduce the rising time of the scan driver signal waveform; when the scan driver signal becomes low, the positive feedback from the fifth P-type TFT of the feedback regulation module will enhance the pull-up capability of the signal processing module so as to reduce the falling time of the scan driver signal waveform; that is, the present invention can reduce the RC loading of the scan driver signal and improve the stability of high resolution display panel.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
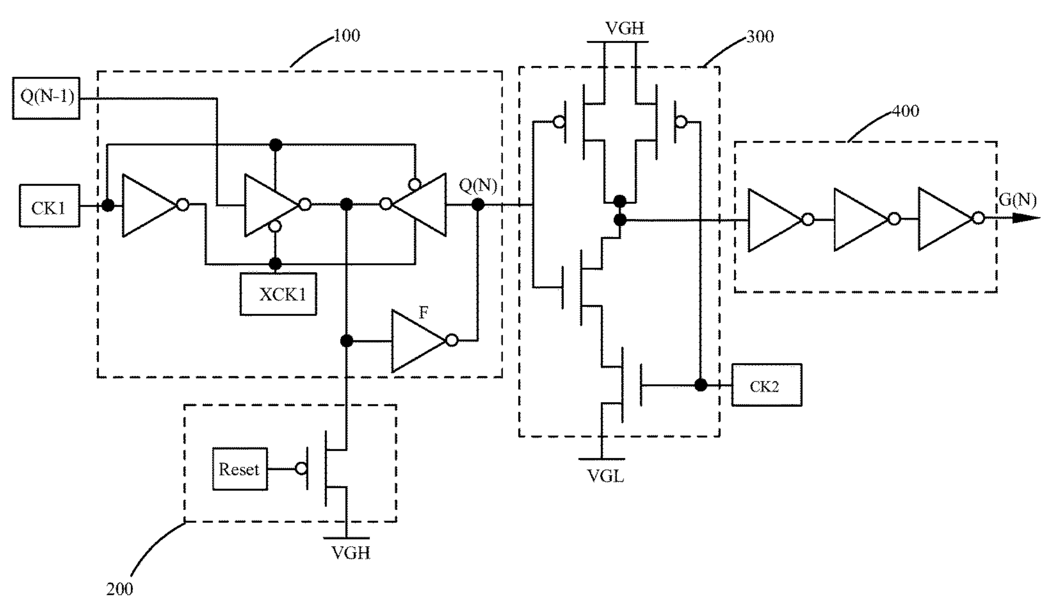
FIG. 1 is a schematic view showing the structure of known COMS GOA circuit.
Figure 2:
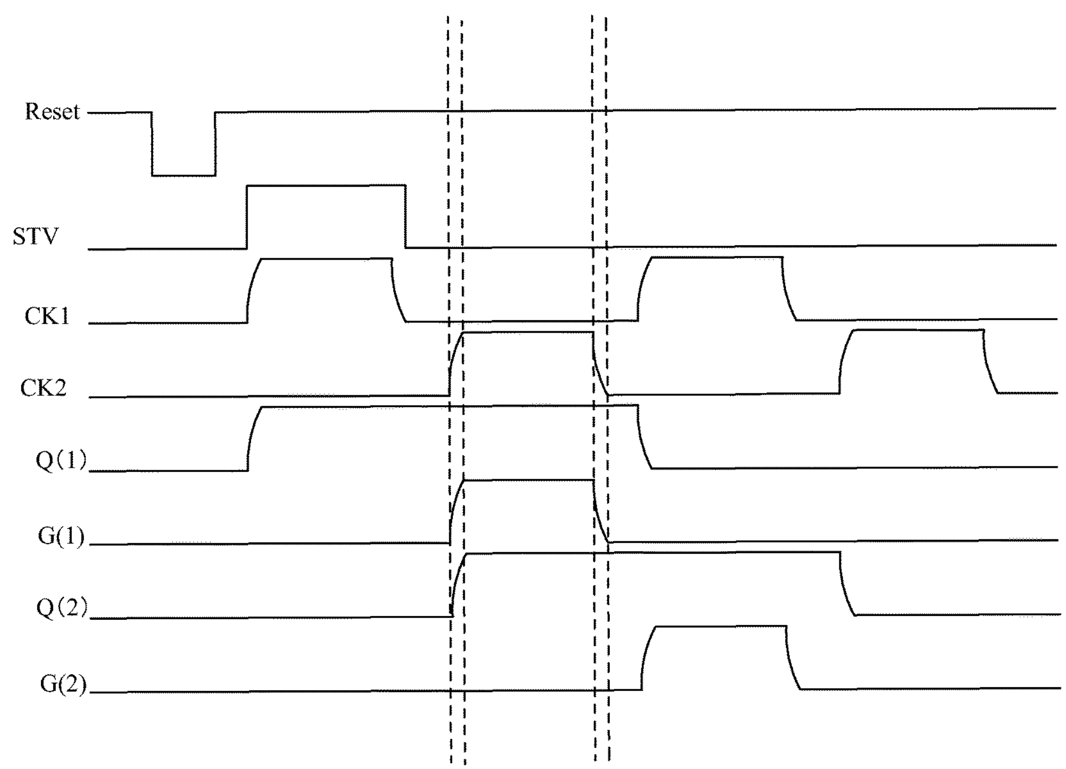
FIG. 2 is a schematic view showing the operation timing of the CMOS GOA circuit in FIG. 1.
Figure 3:
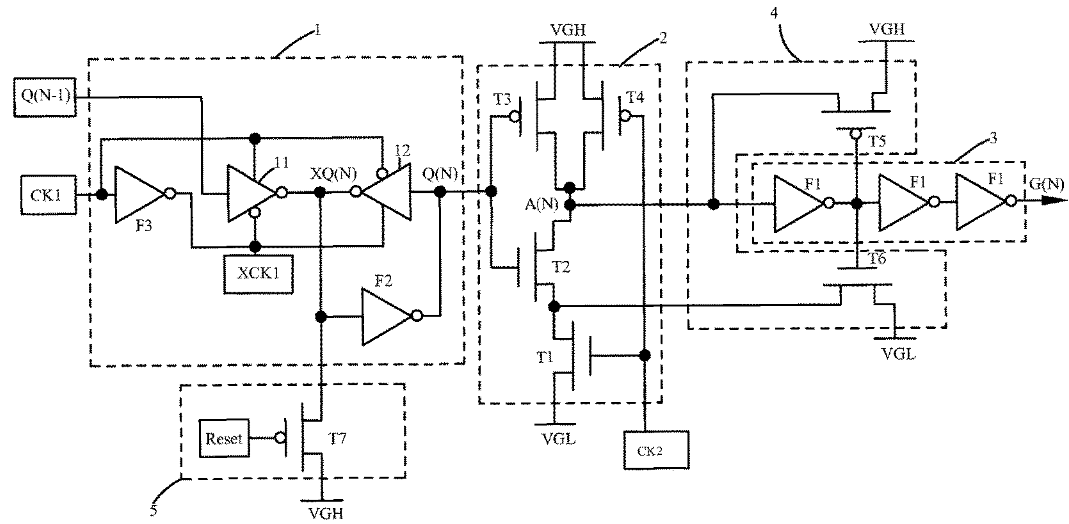
FIG. 3 is a schematic view showing the first embodiment of the CMOS GOA circuit provided by the an embodiment of the present invention.

The present invention provides a CMOS GOA circuit. Refer to FIGS. 3. FIG. 3 shows the first embodiment of the CMOS GOA circuit of the present invention, which comprises: a plurality of cascade GOA units, for a positive integer N, the N-th stage GOA unit comprising: an input and latch module 1, a signal processing module 2 connected to the input and latch module 1, an output buffer module 3 connected to the signal processing module 2, and a feedback regulation module 4 connected to the output buffer module 3 and the signal processing module 2.

The input and latch module 1 is connected to input a stage-propagated signal Q(N−1) from a previous stage (N−1)-th stage GOA unit, a first clock signal CK1, a first inverted clock signal XCK1, for inverting the stage-propagated signal Q(N−1) from the (N−1)-th stage GOA unit to obtain an inverted stage-propagated signal XQ(N), and then inverting the inverted stage-propagated signal XQ(N) to obtain a stage-propagated signal Q(N) and latching the stage-propagated signal Q(N). Specifically, the input and latch module comprises: a clock control input circuit 11, having two control ends connected to the first clock signal CK1 and the first inverted clock signal XCK1 respectively, an input end connected to input the stage-propagated signal Q(N−1) from the previous stage (N−1)-th stage GOA unit, and an output end to output an inverted stage-propagated signal XQ(N) by inverting the stage-propagated signal Q(N−1) from the (N−1)-th stage GOA unit; a second inverter F2, having an input end connected to input the inverted stage-propagated signal XQ(N), and an output end to output the stage-propagated signal Q(N); a lock control latch circuit 12, having two control ends connected to the first clock signal CK1 and the first inverted clock signal XCK1 respectively, an input end connected to the stage-propagated signal Q(N), and an output end to output an inverted stage-propagated signal XQ(N) by inverting the stage-propagated signal Q(N); and a third inverter F3, to invert the first clock signal CK1 to obtain the first inverted clock signal XCK1.

Moreover, the clock control input circuit 11 only operates normally when the first clock signal CK1 is at high level and the first inverted clock signal XCK1 is at low level. If the stage-propagated signal Q(N−1) from the previous (N−1)-the stage GOA unit is at high level, the clock control input circuit 11 outputs a low level inverted stage-propagated signal XQ(N), which is then inverted by the second inverter F2 to obtain a high level stage-propagated signal Q(N); if the stage-propagated signal Q(N−1) from the previous (N−1)—the stage GOA unit is at low level, the clock control input circuit 11 outputs a high level inverted stage-propagated signal XQ(N), which is then inverted by the second inverter F2 to obtain a low level stage-propagated signal Q(N). The clock control latch circuit 12 only operates normally when the first clock signal CK1 is at low level and the first inverted clock signal XCK1 is at high level. If the stage-propagated signal Q(N) is at high level, the clock control latch circuit 12 outputs a low level, i.e., keeps the inverted stage-propagated signal XQ(N) at low level, which is then inverted by the second inverter F2 to obtain a high level stage-propagated signal Q(N) to realize the latching of the stage-propagated signal Q(N); if the stage-propagated signal Q(N) is at low level, the clock control latch circuit 12 outputs a high level, i.e., keeps the inverted stage-propagated XQ(N) at high level, which is then inverted by the second inverter F2 to obtain a low level stage-propagated signal Q(N) to realize the latching of the stage-propagated signal Q(N).

The signal processing module is connected to input the stage-propagated signal Q(N), a second clock signal CK2, a constant high level voltage VGH and a constant low level voltage VGL, for performing a NAND operation on the second clock signal CK2 and the stage-propagated signal Q(N) to generate a scan driver signal G(N) for the N-th stage GOA unit. Specifically, the signal processing module 2 is a NAND gate in actuality, comprising a first N-type TFT T1 with a gate connected to the second clock signal CK2, and a source connected to the constant low level voltage VGL; a second N-type TFT T2, with a gate connected to the stage-propagated signal Q(N), a source connected to a drain of the first N-type TFT T1, and a drain connected to the output end A(N) of the signal processing module 2; a third P-type TFT T3, with a gate connected to the stage-propagated signal Q(N), a source connected to the constant high level voltage VGH, and a drain connected to the output end A(N) of the signal processing module 2; a fourth P-type TFT T4, with a gate connected to the second clock signal Ck2, a source connected to the constant high level voltage VGH and a drain connected to the output end A(N) of the signal processing module 2. Moreover, when the first N-type TFT T1 and the second N-type TFT T2 are both conductive, and the output end A(N) of the signal processing module 2 outputs the constant low level voltage VGL; when one of the stage-propagated signal Q(N) and the second clock signal CK2 is low, the third P-type TFT T3 or the fourth P-type TFT T4 is conductive, and the output end A(N) of the signal processing module 2 outputs the constant high level voltage VGH.

The output buffer module 3 comprises an odd-number of serially connected first inverters F1, for outputting the scan driver signal G(N) and enhancing the driving power of the scan driver signal G(N). Preferably, the output buffer module 3 comprises three first inverters F1 serially connected, the input end of the first invert F1 closest to the signal processing module 2 is connected to the output end A(N) of the signal processing module 2, and the output end of the first inverter F1 farthest from the signal processing module 2 outputs the scan driver signal G(N). When the output end A(N) of the signal processing module 2 is at low level, the scan driver signal G(N) is at high level after inverted by the first of the three serially connected first inverters F1; when the output end A(N) of the signal processing module 2 is at high level, the scan driver signal G(N) is at low level after inverted by the first of the three serially connected first inverter F1.

It should be noted that the feedback regulation module 4 comprises a fifth P-type TFT T5, and a sixth N-type TFT T6. In the first embodiment in FIG. 3, the fifth P-type TFT T5 has a gate connected to an output end of the first first inverter F1 of the output buffer module 3, a source connected to the constant high level voltage VGH, and a drain connected to an input end of the first first inverter F1 of the output buffer module 3 and the output end A(N) of the signal processing module 2; the sixth N-type TFT T6 has a gate connected to an output end of the first first inverter F1 of the output buffer module 3, a source connected to the constant low level voltage VGL, and a drain connected to the drain of the first N-type TFT T1 and the source of the second N-type TFT T2.

Figure 7:
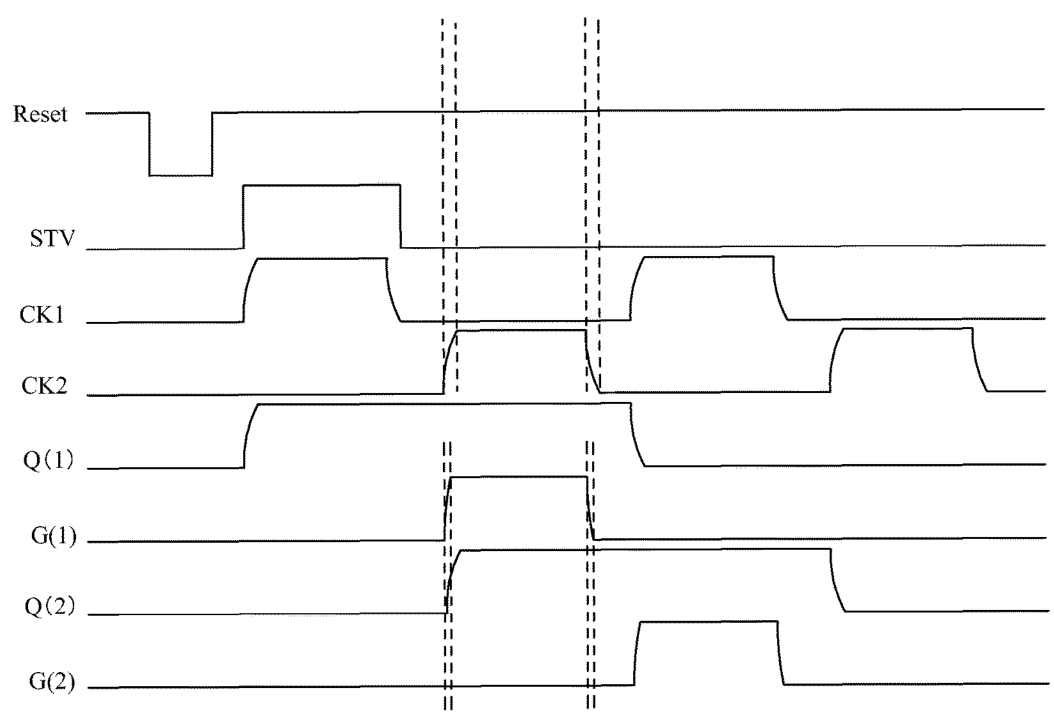
FIG. 7 is a schematic view showing the operation timing of the CMOS GOA circuit provided by an embodiment of the present invention.

Refer to FIG. 3 and FIG. 7. When the high level scan driver signal G(N) is generated, i.e., the first N-type TFT T1 and the second N-type TFT T2 are both conductive, the output end A(N) of the signal processing module 2 is at low level, and after inverted by the first first inverter F1 of the output buffer module 3, the output becomes high to make the sixth N-type TFT T6 conductive and the fifth P-type TFT T5 cut-off. At this point, the sixth N-type TFT T6 with the second N-type TFT T2, and the first N-type TFT T1 with the second N-type TFT T2 form a pull-down conduction respectively. Through the positive feedback of T6, the pull-down capability of the signal processing module 2 is enhanced and the rising time of the waveform of the scan driver signal G(N) is reduced. When the scan driver signal G(N) finishes and becomes low, the second clock signal also becomes low. The fourth P-type TFT is conductive and the output end A(N) of the signal processing module 2 becomes high, accompanied by the stage-propagated signal Q(N) becoming low. The third P-type TFT T3 is also conductive to make the output end A(N) of the signal processing module 2 still outputs high, which is then inverted by the first first inverter F1 of the output buffer module 3 to become low to make the fifth P-type TFT T5 conductive and the sixth N-type TFT T6 cut-off. At this point, the third P-type TFT T3, the fourth P-type TFT T4 and the fifth P-type TFT T5 form a pull-up conduction respectively. Through the positive feedback of T5, the pull-up capability of the signal processing module 2 is enhanced and the falling time of the waveform of the scan driver signal G(N) is reduced.

Before the GOA circuit of the present invention starts normal operation, a voltage level reset process must be performed on the stage-propagated signal and scan driver signal. Therefore, each stage GOA unit of the CMOS GOA circuit of the present invention also comprises a reset module 5. As shown in FIG. 3, the reset module 5 comprises a seventh P-type TFT T7, having a gate connected to a reset signal Reset, a source connected to the constant high level voltage VGH, and a drain connected to an input end of the second inverter F2. When the reset signal Reset inputs a low level voltage, the seventh P-type TFT T7 becomes conductive and the second inverter F2 performs inverting on the constant high level voltage VGH to pull down the voltage level of the stage-propagated signal Q(N), and then uses the low level stage-propagated signal Q(N) to make the scan driver signal G(N) become low level voltage. As such, the resetting of the stage-propagated signal Q(N) and the scan driver signal G(N) is realized.

Figure 4:
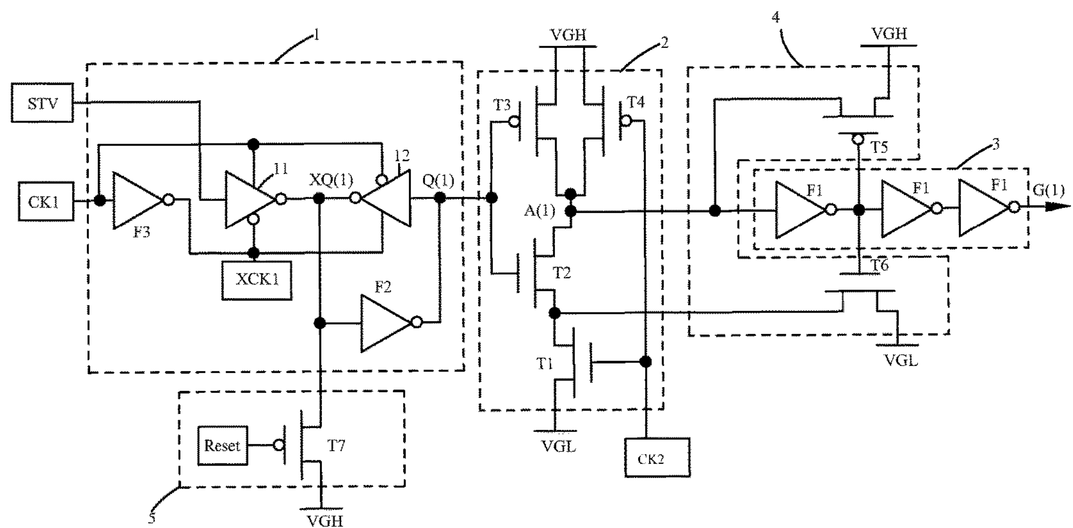
FIG. 4 is a schematic view showing the circuit of the first stage GOA unit in the first embodiment of CMOS GOA circuit provided by an embodiment of the present invention.

Specifically, as shown in FIG. 4, in the first stage GOA unit, the input end of the clock control input circuit 11 is connected to a circuit activation signal STV. Refer to FIG. 4 and FIG. 7, when the CMOS GOA circuit starts normal operation, the circuit activation signal SW is at high level, the first clock signal CK1 is at high level and the first inverted clock signal XCK1 is at low level, the clock control input circuit 11 outputs a low inverted stage-propagated signal XQ(1), which is inverted by the second inverter F2 to become a high stage-propagated signal Q(1). After the first clock signal CK1 turns low and the first inverted clock signal XCK1 turn high, the stage-propagated signal Q(1) latched by the clock control latch circuit 12 stays at high level, and the second N-type TFT T2 is conductive. As the second clock signal CK2 becomes high, the first N-type TFT T1 is conductive and the output end A(1) of the signal processing module 2 becomes low. After inverted by the three serially connected first inverters F1 of the output buffer module 3, the scan driver signal G(1) is at high level. Then, the second stage GOA unit receives the stage-propagated signal Q(1) from the first stage GOA unit to perform scan driving, and so on, until the last stage GOA unit finishes scan driving.

Figure 5:
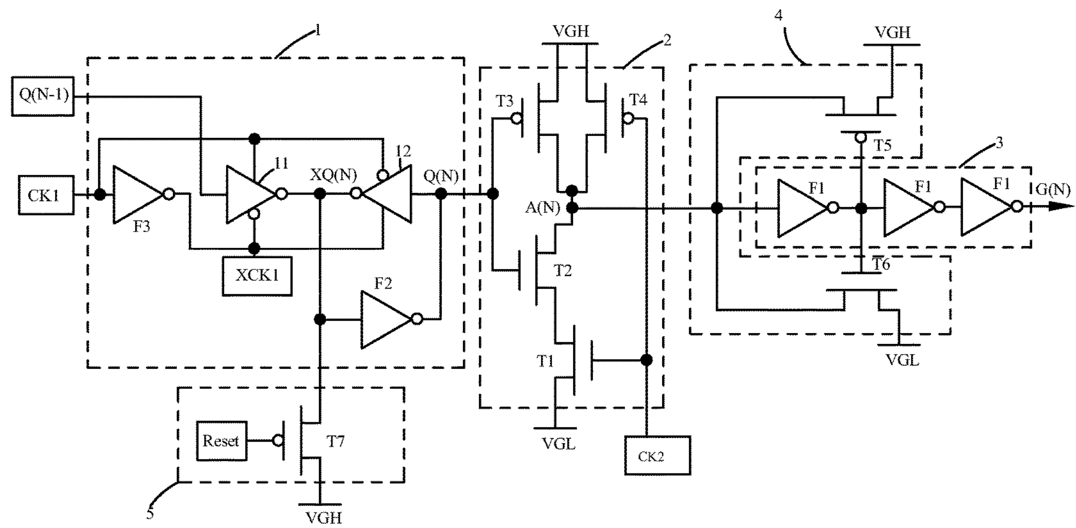
FIG. 5 is a schematic view showing the second embodiment of the CMOS GOA circuit provided by the an embodiment of the present invention.

FIG. 5 shows the second embodiment of CMOS GOA circuit of the present invention. The second embodiment differs from the first embodiment in that the drain of the sixth N-type TFT T6 of the feedback regulation module 4 is connected to the input end of the first first inverter F1 of the output buffer module 3 and the output end A(N) of the signal processing module 2.

Refer to FIG. 5 and FIG. 7. When the high level scan driver signal G(N) is generated, i.e., the first N-type TFT T1 and the second N-type TFT T2 are both conductive, the output end A(N) of the signal processing module 2 is at low level, and after inverted by the first first inverter F1 of the output buffer module 3, the output becomes high to make the sixth N-type TFT T6 conductive and the fifth P-type TFT T5 cut-off. At this point, the sixth N-type TFT T6, the first N-type TFT T1, and the second N-type TFT T2 form a pull-down conduction respectively. Through the positive feedback of T6, the pull-down capability of the signal processing module 2 is enhanced and the rising time of the waveform of the scan driver signal G(N) is reduced.

The remaining structure and operation is the same as the first embodiment, and will not be repeated here.

Figure 6:
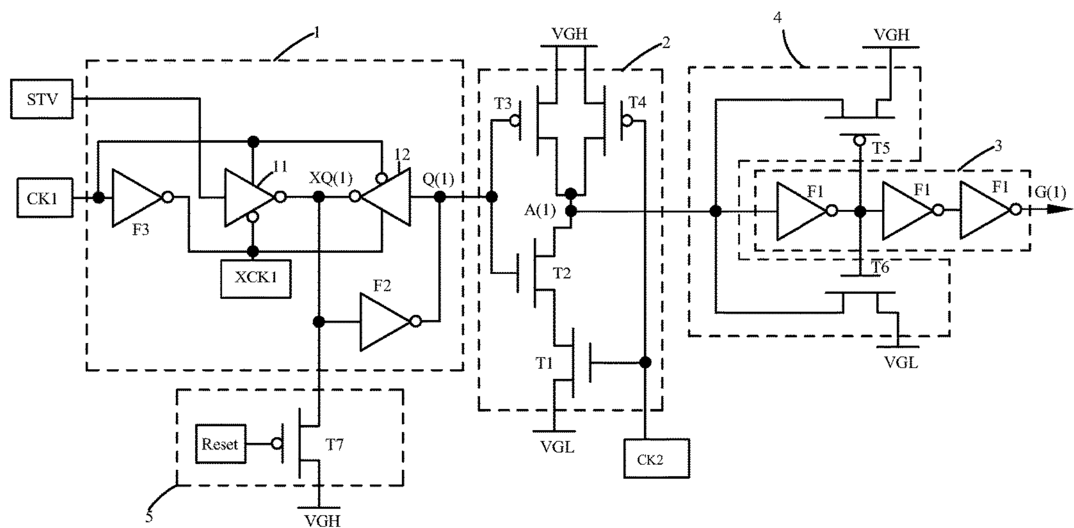
FIG. 6 is a schematic view showing the circuit of the first stage GOA unit in the second embodiment of CMOS GOA circuit provided by an embodiment of the present invention.

Specifically, as shown in FIG. 6, in the first GOA unit, the input end of the clock control input circuit 11 is also connected to input the circuit activation signal STV.

In summary, the present invention provides a CMOS GOA circuit, by disposing the feedback regulation module connected to the output buffer module and the signal processing module in the GOA unit, the present invention accomplishes the following: when the scan driver signal becomes high, the positive feedback from the sixth N-type TFT of the feedback regulation module will enhance the pull-down capability of the signal processing module so as to reduce the rising time of the scan driver signal waveform; when the scan driver signal becomes low, the positive feedback from the fifth P-type TFT of the feedback regulation module will enhance the pull-up capability of the signal processing module so as to reduce the falling time of the scan driver signal waveform; that is, the present invention can reduce the RC loading of the scan driver signal and improve the stability of high resolution display panel.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A complementary metal-oxide-semiconductor (CMOS) gate driver on array (GOA) circuit, which comprises:

a plurality of cascade GOA units, for a positive integer N, the N-th stage GOA unit comprising: an input and latch module, a signal processing module connected to the input and latch module, an output buffer module connected to the signal processing module, and a feedback regulation module connected to the output buffer module and the signal processing module;

wherein the input and latch module is connected to input a stage-propagated signal from a previous stage (N−1)-th stage GOA unit, a first clock signal, a first inverted clock signal, for inverting the stage-propagated signal form the (N−1)-th stage GOA unit to obtain an inverted stage-propagated signal, and then inverting the inverted stage-propagated signal to obtain a stage-propagated signal and latching the stage-propagated signal;

the signal processing module is connected to input the stage-propagated signal, a second clock signal, a constant high level voltage and a constant low level voltage, for performing a NAND operation on the second clock signal and the stage-propagated signal to generate a scan driver signal for the N-th stage GOA unit;

the output buffer module comprises an odd-number of serially connected first inverters, for outputting the scan driver signal and enhancing the driving power of the scan driver signal; and the feedback regulation module comprises a fifth P-type thin film transistor (TFT), and a sixth N-type TFT; the fifth P-type TFT has a gate connected to an output end of a first first inverter of the output buffer module, a source connected to the constant high level voltage, and a drain connected to an input end of the first first inverter of the output buffer module and the output end of the signal processing module to enhance the pull-up capability of the signal processing module and reduce the falling time of the scan driver signal; the sixth N-type TFT has a gate connected to an output end of the first first inverter of the output buffer module, a source connected to the constant low level voltage to enhance the pull-down capability of the signal processing module and reduce the rising time of the scan driver signal.

2. The CMOS GOA circuit as claimed in claim 1, wherein the signal processing module comprises: a first N-type TFT, with a gate connected to the second clock signal, and a source connected to the constant low level voltage; a second N-type TFT, with a gate connected to the stage-propagated signal, a source connected to a drain of the first N-type TFT, and a drain connected to the output end of the signal processing module; a third P-type TFT, with a gate connected to the stage-propagated signal, a source connected to the constant high level voltage and a drain connected to the output end of the signal processing module; a fourth P-type TFT, with a gate connected to the second clock signal, a source connected to the constant high level voltage and a drain connected to the output end of the signal processing module.

3. The CMOS GOA circuit as claimed in claim 2, wherein the drain of the sixth N-type TFT is connected to the drain of the first N-type TFT and the source of the second N-type TFT.

4. The CMOS GOA circuit as claimed in claim 2, wherein the drain of the sixth N-type TFT is connected to the input end of the first first inverter of the output buffer module and the output end of the signal processing module.

5. The CMOS GOA circuit as claimed in claim 1, wherein the input and latch module comprises:

a clock control input circuit, having two control ends connected to the first clock signal and the first inverted clock signal respectively, an input end connected to input the stage-propagated signal from the previous stage (N−1)-th stage GOA unit, and an output end to output an inverted stage-propagated signal by inverting the stage-propagated signal from the (N−1)-th stage GOA unit;

a second inverter, having an input end connected to input the inverted stage-propagated signal, and an output end to output the stage-propagated signal;

a lock control latch circuit, having two control ends connected to the first clock signal and the first inverted clock signal respectively, an input end connected to the stage-propagated signal, and an output end to output an inverted stage-propagated signal by inverting the stage-propagated signal.

6. The CMOS GOA circuit as claimed in claim 5, wherein the input and latch module further comprises: a third inverter, to invert the first clock signal to obtain the first inverted clock signal.

7. The CMOS GOA circuit as claimed in claim 5, further comprises a reset module, which further comprising: a seventh P-type TFT, with a gate connected to input a reset signal, a source connected to the constant high level voltage, and a drain connected to the input end of the second inverter.

8. The CMOS GOA circuit as claimed in claim 5, wherein in the first stage GOA circuit, the input end of the clock control input circuit is connected to the circuit activation signal.

9. The CMOS GOA circuit as claimed in claim 2, wherein the output buffer module comprises three first inverters serially connected, the input end of a first invert closest to the signal processing module is connected to the output end of the signal processing module, and an output end of a first inverter farthest from the signal processing module outputs the scan driver signal.

10. A complementary metal-oxide-semiconductor (CMOS) gate driver on array (GOA) circuit, which comprises: a plurality of cascade GOA units;

for a positive integer N, the N-th stage GOA unit comprising: an input and latch module, a signal processing module connected to the input and latch module, an output buffer module connected to the signal processing module, and a feedback regulation module connected to the output buffer module and the signal processing module;

wherein the input and latch module is connected to input a stage-propagated signal from a previous stage (N−1)-th stage GOA unit, a first clock signal, a first inverted clock signal, for inverting the stage-propagated signal form the (N−1)-th stage GOA unit to obtain an inverted stage-propagated signal, and then inverting the inverted stage-propagated signal to obtain a stage-propagated signal and latching the stage-propagated signal;

the signal processing module is connected to input the stage-propagated signal, a second clock signal, a constant high level voltage and a constant low level voltage, for performing a NAND operation on the second clock signal and the stage-propagated signal to generate a scan driver signal for the N-th stage GOA unit;

the output buffer module comprises an odd-number of serially connected first inverters, for outputting the scan driver signal and enhancing the driving power of the scan driver signal; and the feedback regulation module comprises a fifth P-type thin film transistor (TFT), and a sixth N-type TFT; the fifth P-type TFT has a gate connected to an output end of the first first inverter of the output buffer module, a source connected to the constant high level voltage, and a drain connected to an input end of a first first inverter of the output buffer module and the output end of the signal processing module to enhance the pull-up capability of the signal processing module and reduce the falling time of the scan driver signal; the sixth N-type TFT has a gate connected to an output end of the first first inverter of the output buffer module, a source connected to the constant low level voltage to enhance the pull-down capability of the signal processing module and reduce the rising time of the scan driver signal;

wherein the signal processing module comprises: a first N-type TFT, with a gate connected to the second clock signal, and a source connected to the constant low level voltage; a second N-type TFT, with a gate connected to the stage-propagated signal, a source connected to a drain of the first N-type TFT, and a drain connected to the output end of the signal processing module; a third P-type TFT, with a gate connected to the stage-propagated signal, a source connected to the constant high level voltage and a drain connected to the output end of the signal processing module; a fourth P-type TFT, with a gate connected to the second clock signal, a source connected to the constant high level voltage and a drain connected to the output end of the signal processing module;

wherein the drain of the sixth N-type TFT is connected to the drain of the first N-type TFT and the source of the second N-type TFT;

wherein the input and latch module comprises:

a clock control input circuit, having two control ends connected to the first clock signal and the first inverted clock signal respectively, an input end connected to input the stage-propagated signal from the previous stage (N−1)-th stage GOA unit, and an output end to output an inverted stage-propagated signal by inverting the stage-propagated signal from the (N−1)-th stage GOA unit;

a second inverter, having an input end connected to input the inverted stage-propagated signal, and an output end to output the stage-propagated signal; and a lock control latch circuit, having two control ends connected to the first clock signal and the first inverted clock signal respectively, an input end connected to the stage-propagated signal from, and an output end to output an inverted stage-propagated signal by inverting the stage-propagated signal.

11. The CMOS GOA circuit as claimed in claim 10, wherein the input and latch module further comprises: a third inverter, to invert the first clock signal to obtain the first inverted clock signal.

12. The CMOS GOA circuit as claimed in claim 10, further comprises a reset module, which further comprising: a seventh P-type TFT, with a gate connected to input a reset signal, a source connected to the constant high level voltage, and a drain connected to the input end of the second inverter.

13. The CMOS GOA circuit as claimed in claim 10, wherein in the first stage GOA circuit, the input end of the clock control input circuit is connected to the circuit activation signal.

14. The CMOS GOA circuit as claimed in claim 10, wherein the output buffer module comprises three first inverters serially connected, the input end of a first invert closest to the signal processing module is connected to the output end of the signal processing module, and an output end of a first inverter farthest from the signal processing module outputs the scan driver signal.

* * * * *

UNITED STATES PATENT AND TRADEMARK OFFICE

CERTIFICATE OF CORRECTION

PATENT NO. : 9,799,296 B2
APPLICATION NO. : 14/913981
DATED : October 24, 2017
INVENTOR(S) : Mang Zhao It is certified that error appears in the above-identified patent and that said Letters Patent is hereby corrected as shown below:

On the Title Page

Item (73) Assignee should read:
WUHAN CHINA STAR OPTOELECTRONICS TECHNOLOGY CO., LTD.

Signed and Sealed this
Twenty-fifth Day of September, 2018

Andrei Iancu
*Director of the United States Patent and Trademark Office*